United States Patent
Abe et al.

(10) Patent No.: US 7,601,968 B2
(45) Date of Patent: Oct. 13, 2009

(54) CHARGED PARTICLE BEAM WRITING METHOD AND APPARATUS

(75) Inventors: Takayuki Abe, Kanagawa (JP); Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 267 days.

(21) Appl. No.: 11/563,109

(22) Filed: Nov. 24, 2006

(65) Prior Publication Data
US 2007/0138413 A1  Jun. 21, 2007

(30) Foreign Application Priority Data
Dec. 15, 2005 (JP) .............. 2005-361338

(51) Int. Cl.
*G21K 1/087* (2006.01)
(52) U.S. Cl. .............. 250/396 R; 250/492.1; 250/492.2; 250/492.22; 250/492.3
(58) Field of Classification Search .......... 250/396 R, 250/492.1, 492.2, 492.22, 492.3
See application file for complete search history.

(56) References Cited

U.S. PATENT DOCUMENTS

| | | | | |
|---|---|---|---|---|
| 4,853,870 A | * | 8/1989 | Yasutake et al. ............. | 716/21 |
| 5,173,582 A | * | 12/1992 | Sakamoto et al. ...... | 219/121.25 |
| 5,430,304 A | * | 7/1995 | Yasuda et al. .......... | 250/492.22 |
| 5,530,250 A | * | 6/1996 | Yamashita ............... | 250/396 R |
| 6,667,486 B2 | * | 12/2003 | Ohta et al. ............. | 250/492.22 |
| 2006/0255284 A1 | * | 11/2006 | Hill et al. ................. | 250/396 R |

FOREIGN PATENT DOCUMENTS

| | | |
|---|---|---|
| JP | 63-92020 | 4/1988 |
| KR | 0100395 | 2/1996 |

* cited by examiner

*Primary Examiner*—David A Vanore
*Assistant Examiner*—Michael Maskell
(74) *Attorney, Agent, or Firm*—Oblon, Spivak, McClelland, Maier & Neustadt, L.L.P.

(57) ABSTRACT

A charged particle beam writing method includes irradiating a shot of a charged particle beam, and deflecting the charged particle beam of the shot using a plurality of deflectors arranged on an optical path of the charged particle beam to write a pattern on a target object, wherein any one of the plurality of deflectors controls deflection of a charged particle beam of a shot different from a shot which is controlled in deflection by another deflector in the same period.

15 Claims, 13 Drawing Sheets

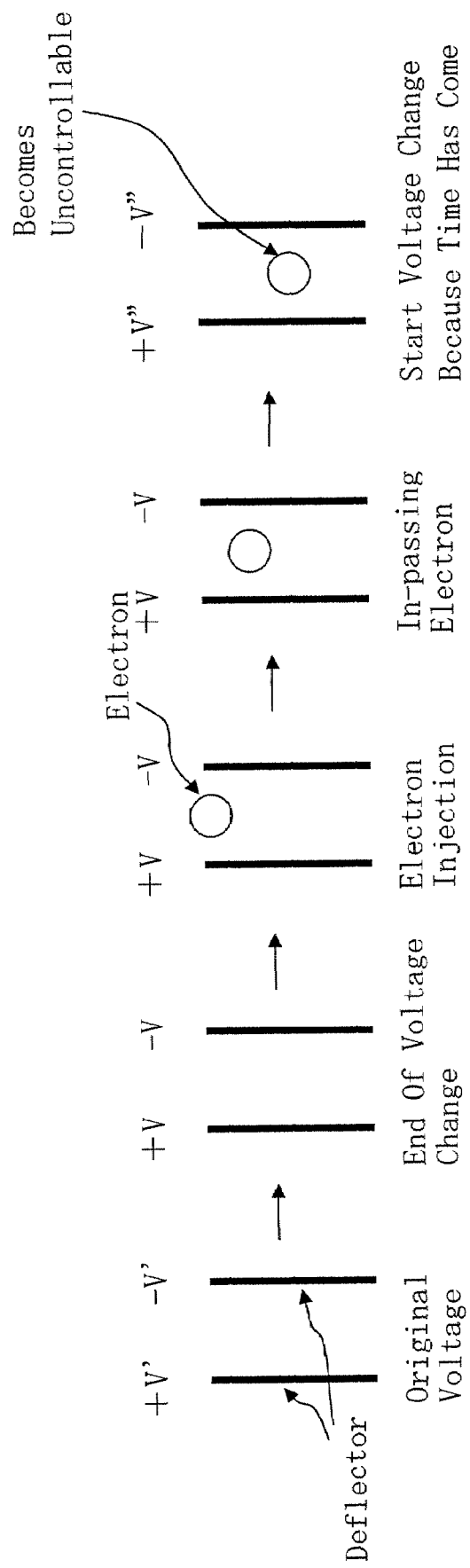
FIG. 9A  Original Voltage
FIG. 9B  End Of Voltage Change
FIG. 9C  Electron Injection
FIG. 9D  In-passing Electron
FIG. 9E  Start Voltage Change Because Time Has Come

CHARGED PARTICLE BEAM WRITING METHOD AND APPARATUS

CROSS-REFERENCE TO RELATED APPLICATION

This application is based upon and claims the benefit of priority from prior Japanese Patent Application No. 2005-361338 filed on Dec. 15, 2005 in Japan, the entire contents of which are incorporated herein by reference.

BACKGROUND OF THE INVENTION

1. Field of the Invention

The present invention relates to a charged particle beam writing method and a charged particle beam writing apparatus, for example, an electron beam writing apparatus which uses a deflector to deflect an electron beam.

2. Related Art

A lithography technique which leads development of micropatterning of a semiconductor device is a very important process which uniquely generates a pattern in semiconductor manufacturing processes. In recent years, with high integration of an LSI, a circuit line width required for semiconductor devices progressively decreases year after year. In order to form a desired circuit pattern on the semiconductor devices, a high-definition original pattern (also called a reticle or a mask) is necessary. In this case, an electron beam writing technique has an essentially excellent resolution and is used in production of a high-definition original pattern.

FIG. 13 is a conceptual view for explaining an operation of a conventional variable-shaped electron beam photolithography apparatus.

In the variable-shaped electron beam photolithography apparatus (electron beam (EB) writing apparatus), writing is performed as follows. An opening 411 having a rectangular shape, for example, a square shape to shape an electron beam 330 is formed in a first aperture 410. A variable-shaped opening 421 to shape the electron beam 330 having passed through the opening 411 in a desired square shape is formed in a second aperture 420. The electron beam 330 irradiated from a charged particle source 430 and having passed through the opening 411 is deflected by a deflector. The electron beam 330 is irradiated on a target object 340 placed on a stage through a part of the variable-shaped opening 421. At this time, the stage continuously moves in one predetermined direction (for example, defined as an X direction). More specifically, a square shape which can pass through both the opening 411 and the variable-shaped opening 421 is written in a writing region of the target object 340. A scheme which causes an electron beam to pass through both the opening 411 and the variable-shaped opening 421 to form an arbitrary shape is called a variable-shaping scheme.

In general, overall control of electron optics of an electron beam writing apparatus is performed every shot which irradiates the electron beam 330 on the target object 340. More specifically, upon completion of irradiation of one shot, the next shot is prepared. The next shot is performed. In the electron beam writing apparatus, the electron beam 330 reaches the target object 340 while being deflected by a plurality of deflectors. In this case, upon completion of one shot, a period for preparing amplification to apply a voltage to the deflectors is necessary as a preparation period (so-called settling time) for the next shot.

As a technique related to the settling time, a technique which matches settling time to the longest preparation period of amplification is disclosed in a reference (for example, see JP-A-63-92020).

With an increase in degree of integration density of an LSI, time required for writing a mask by an electron beam writing apparatus or direct writing time required when writing is directly performed on a wafer or the like explosively increases. In order to cope with this, a current density of an electron beam used in the writing apparatus must be increased, or a device to shorten settling time between shots is required. In this case, as described above, in a conventional method, preparation for the next shot is performed upon completion of irradiation of one shot. In this method, the system has limitations even though irradiation time is shortened by increasing a current density of an electron beam and settling time is shortened by improving the capabilities of amplifiers for deflectors. For this reason, it is difficult to further shorten the writing time.

BRIEF SUMMARY OF THE INVENTION

Therefore, it is an object of the present invention to provide a method and apparatus which further shorten writing time.

In accordance with one aspect of the present invention, a pattern writing method with using a charged particle beam includes irradiating a shot of a charged particle beam, and deflecting the charged particle beam of the shot using a plurality of deflectors arranged on an optical path of the charged particle beam to write a pattern on a target object, wherein any one of the plurality of deflectors controls deflection of a charged particle beam of a shot different from a shot which is controlled in deflection by another deflector in the same period.

In accordance with another aspect of the present invention, a pattern writing method with using a charged particle beam includes irradiating a shot of a charged particle beam, deflecting a charged particle of the beam to write a pattern on a target object, independently applying voltages to deflectors in accordance with movement of the charged particle, by using the deflectors obtained by dividing a base deflector to cause the charged particle to obtain a predetermined amount of deflection in a plurality of stages, when deflecting the charged particle, being begun to perform preparation for deflection of the next shot by at least another deflector when deflecting by one of the deflectors for a certain shot, and performing control which charges an appropriate voltage as a sum of the deflectors to the charged particle irradiated, when deflecting the charged particle.

In accordance with another aspect of the present invention, a charged particle beam writing apparatus includes a first deflector which does not deflect a charged particle beam to set a beam-on state and which deflects the charged particle beam to set a beam-off state, a second deflector which deflects the charged particle beam to shape the beam, and a third deflector which deflects the charged particle beam to a predetermined position on a target object, wherein at least two deflectors of the first, second, and third deflectors control deflection of charged particle beams of different shots in the same period.

In accordance with another aspect of the present invention, a charged particle beam writing apparatus includes an irradiation unit which irradiates a charged particle beam, deflectors of a plurality of stages each having a deflector length which is shorter than a deflector length to cause each charged particle in the charged particle beam to obtain a predetermined amount of deflection, and a voltage applying unit which independently applies voltages to the deflectors of the plurality of stages in accordance with movement of the charged particle.

BRIEF DESCRIPTION OF THE DRAWINGS

FIGS. 9A to 9E are diagrams for explaining manners of an electron passing through deflectors which are not multistaged;

DETAILED DESCRIPTION OF THE INVENTION

In the following embodiments, a configuration using an electron beam will be described as an example of a charged particle beam. However, the charged particle beam is not limited to an electron beam, another beam such as an ion beam using other charged particles may be used.

First Embodiment

Figure 1:
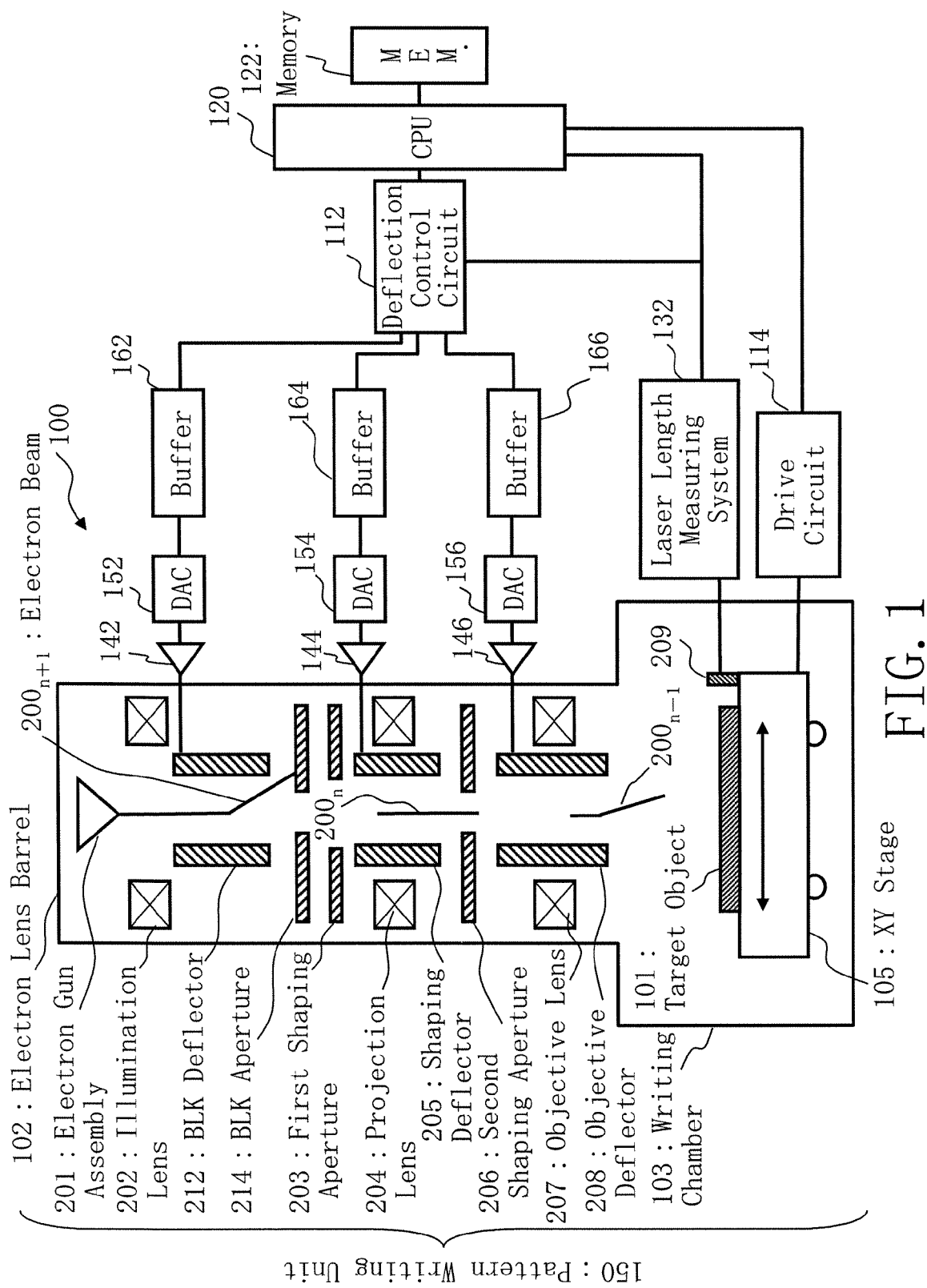
FIG. 1 is a conceptual diagram showing a configuration of a writing apparatus according to a first embodiment.

FIG. 1 is a conceptual diagram showing a configuration of a writing apparatus according to a first embodiment.

FIG. 1 shows, as an example of a charged particle beam writing apparatus, a writing apparatus 100 serving as a variable-shaped electron beam writing apparatus. The writing apparatus 100 writes, or "draws" a pattern on a target object 101. The writing apparatus 100 includes a pattern writing unit 150 and a control system. The pattern writing unit 150 includes an electron lens barrel 102, a writing chamber 103, an X-Y stage 105, an electron gun assembly 201, an illumination lens 202, a blanking (BLK) deflector 212, a BLK aperture 214, a first shaping aperture 203, a projection lens 204, a shaping deflector 205, a second shaping aperture 206, an objective lens 207, an objective deflector, or "position deflector" 208, and a reflecting mirror 209. The control system includes a control computer (CPU) 120 serving as a computer, a memory 122, a deflection control circuit 112, a laser length measuring system 132, a drive circuit 114, a deflecting amplifier 142, 144 and 146, a digital/analog converter (DAC) 152, 154 and 156, a buffer memory 162, 164 and 166.

In the electron lens barrel 102, the electron gun assembly 201, the illumination lens 202, the BLK deflector 212, the BLK aperture 214, the first shaping aperture 203, the projection lens 204, the shaping deflector 205, the second shaping aperture 206, the objective lens 207, and the objective deflector 208 are arranged. In the writing chamber 103, the X-Y stage 105 is arranged. The reflecting mirror 209 for measuring a laser length is arranged on the X-Y stage 105.

For example, the electrostatic BLK deflector 212 (an example of a first deflector) causes an electron beam 200 to pass without being deflected to set a beam-on state, and deflects the electron beam 200 to set a beam-off state. For example, the electrostatic shaping deflector 205 (an example of a second deflector) is arranged behind the BLK deflector 212 on the optical path and deflects the electron beam 200 to shape the electron beam 200. For example, the electrostatic objective deflector 208 (an example of a third deflector) is arranged behind the shaping deflector 205 on the optical path and deflects the electron beam 200 to a predetermined position on a target object 101. The target object 101 includes a mask for writing, or "drawing".

The memory 122, the deflection control circuit 112, the laser length measuring system 132, and the drive circuit 114 are connected to the CPU 120 through a bus (not shown). The deflection control circuit 112 and the drive circuit 114 are controlled by the CPU 120. Information, arithmetic operation result, and the like input to the CPU 120 are stored (memorized) in the memory 122. The laser length measuring system 132, the buffer memory 162, the buffer memory 164, and the buffer memory 166 are further connected to the deflection control circuit 112 through a bus (not shown). The DAC 152 is connected to the buffer memory 162, the deflecting amplifier 142 is connected to the DAC 152, and the deflecting amplifier 142 is connected to the BLK deflector 212. Similarly, the DAC 154 is connected to the buffer memory 164 the deflecting amplifier 144 is connected to the DAC 154, and the deflecting amplifier 144 is connected to the shaping deflector 205. Similarly, the DAC 156 is connected to the buffer memory 166, the deflecting amplifier 146 is connected to the DAC 156, and the deflecting amplifier 146 is connected to the objective deflector 208. In FIG. 1, constituent parts required for explaining the first embodiment are described. Other configurations which are generally required for the writing apparatus 100 are included as a matter of course.

The electron beam 200 irradiated from the electron gun assembly 201 is converged by the illumination lens 202, forms a crossover by the BLK aperture 214, and passes through the BLK aperture 214. Thereafter, the electron beam 200 entirely illuminates the first shaping aperture 203 having a square, for example, rectangular opening. In this case, the electron beam 200 is shaped into a square shape, for example, a rectangular shape. The electron beam 200 of a first aperture image having passed through the first shaping aperture 203 is projected on the second shaping aperture 206 by the projection lens 204. A position of the first aperture image on the second shaping aperture 206 is controlled by the shaping deflector 205 to make it possible to change a beam shape and a beam size. The electron beam 200 of a second aperture image having passed through the second shaping aperture 206 is focused by the objective lens 207 and deflected by the objective deflector 208. The electron beam 200 is irradiated on a desired position of the target object 101 on or "above" the X-Y stage 105 which is movably arranged. The X-Y stage 105 is driven in X and Y directions by the drive circuit 114. A laser beam irradiated from the laser length measuring system 132 is reflected by the reflecting mirror 209, and the reflected beam is received by the laser length measuring system 132 to measure the position of the X-Y stage 105.

The electron lens barrel 102 and the writing chamber in which the X-Y stage 105 is arranged are vacuumed by a vacuum pump (not shown) to have a vacuum atmosphere in which a pressure is lower than the atmospheric pressure.

The BLK deflector 212 is controlled by the deflection control circuit 112, the buffer memory 162, the DAC 152, and the deflecting amplifier 142. The shaping deflector 205 is controlled by the deflection control circuit 112, the buffer memory 164, the DAC 154, and the deflecting amplifier 144. The objective deflector 208 is controlled by the deflection control circuit 112, the buffer memory 166, the DAC 156, and the deflecting amplifier 146.

When the position of the electron beam 200 on the target object 101 is moved, or when irradiation time has elapsed, the electron beam 200 is deflected by the electrostatic BLK deflector 212 in order to prevent the electron beam 200 from being irradiated on an unnecessary region on the target object 101. The deflected electron beam 200 is cut by the BLK aperture 214. As a result, the electron beam 200 is prevented from reaching a surface of the target object 101. The electron beam 200 is deflected by the BLK deflector 212 and cut by the BLK aperture 214, so that shots of the electron beam 200 having a predetermined electron beam length can be formed. More specifically, in a beam-off (blanking-on) state, the electron beam 200 is deflected by the BLK deflector 212 to cause the BLK aperture 214 to cut the electron beam 200. In a beam-on (blanking-off) state, the electron beam 200 passes through the BLK aperture 214 without being deflected by the BLK deflector 212. In FIG. 1, a shot beam progressing to the target object 101 is obtained as an electron beam 200b or an electron beam 200c.

FIGS. 2A to 2D are diagrams for explaining proceedings of an electron beam when preparation for the next shot is performed upon completion of irradiation of one shot. FIGS. 2A to 2D show respective states changing with time. In this specification, it is assumed that an acceleration voltage is set at 50 kV and that a length between the electron gun assembly 201 and the target object 101 is set at about 1 m.

In a conventional system in which irradiation time of one shot and waiting time between shots are about 30 to 40 ns, an electron is irradiated on a target object when a deflector for positioning or shaping has a predetermined voltage. After predetermined irradiation time has elapsed, a voltage is applied to a blanking deflector to end beam irradiation. A voltage for the next shot is applied to the deflector for positioning or shaping, the apparatus waits until the voltage of the deflector becomes a predetermined voltage. This waiting time is waiting time between shots. That is, in such a control, entire voltage control of the deflector for positioning and shaping is performed every irradiation of one shot.

In order to shorten the writing time, a method which increases a current density of the electron beam 200 to shorten the irradiation time and shortens time required for stabilizing a deflector (speeding up of the deflector) is known. For example, irradiation time of one shot is set at 2 ns, and stabilizing time of the deflector is set at 2 ns. However, in the above conventional "method which performs entire voltage control of the deflector for positioning and shaping every irradiation of one shot", writing time cannot be sufficiently shortened. More specifically, even though the shot time is changed from 40 ns obtained in the conventional technique to 2 ns, the writing time cannot be made 1/20.

This will be described below. A traveling distance of an electron accelerated at 50 kV for 1-shot irradiation time of 2 ns is about 24 cm. In FIGS. 2A to 2D, electron beams of respective shots reaching the target object 101 are shown. More specifically, the electron beam 200 which is deflected by the BLK deflector 212 and cut by the BLK aperture 214 is omitted.

Figure 2:
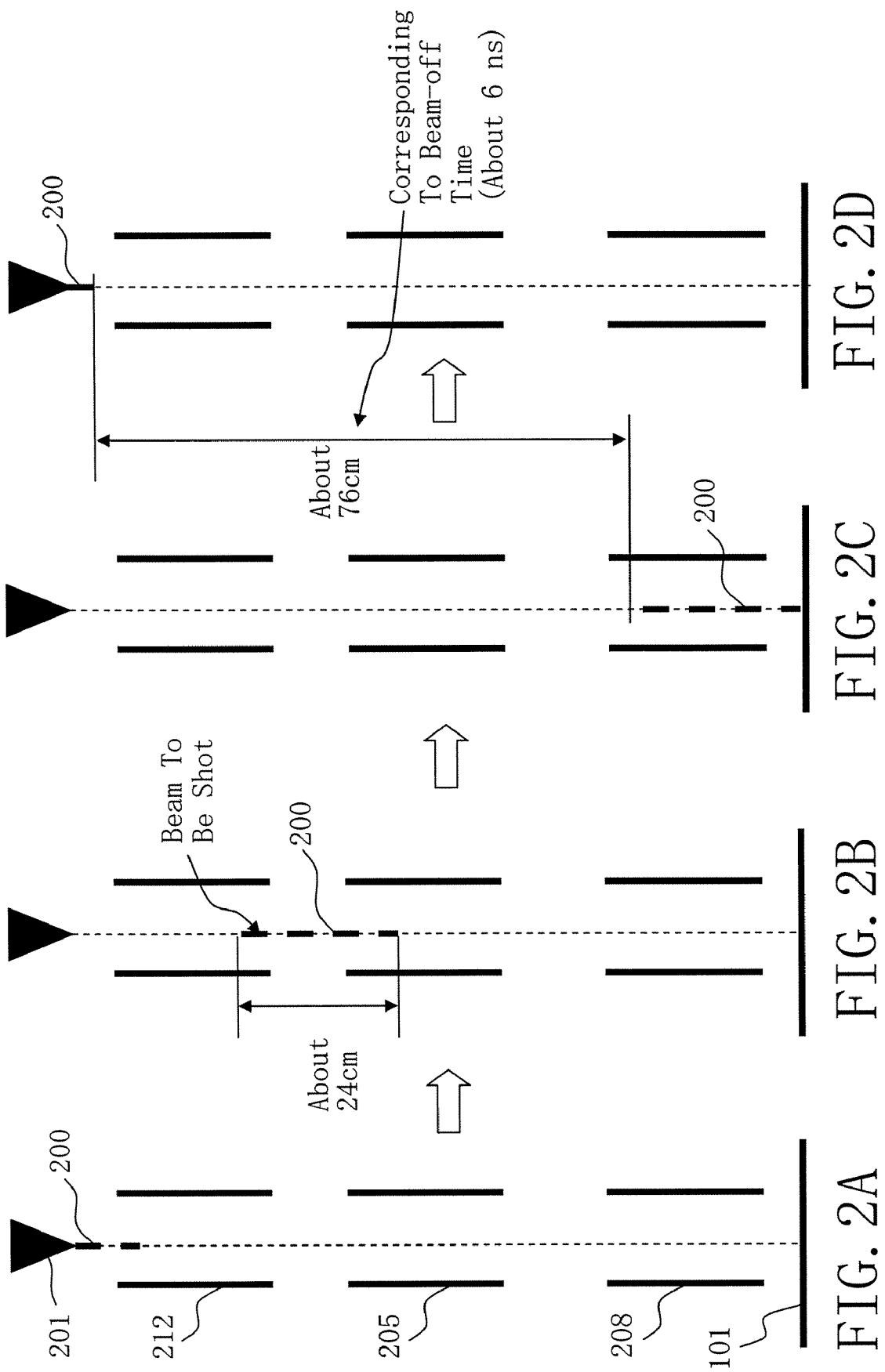
FIGS. 2A to 2D are diagrams for explaining proceedings of an electron beam when preparation for the next shot is performed upon completion of irradiation of one shot.

When, in a shot having the electron beam length, the electron beam 200 of one shot is irradiated from the electron gun assembly 201 as shown in FIG. 2A, the electron beam 200 of one shot passes through the BLK deflector 212 without being deflected by the BLK deflector 212 as shown in FIG. 2B. Thereafter, as shown in FIG. 2C, the electron beam 200 reaches the target object 101 such as a mask to irradiate the target object 101. When the state shown in FIG. 2C changes into a state shown in FIG. 2D, irradiation of the beam of one shot is ended, and a voltage begins to be applied to the deflector to prepare the next shot therefrom. Thereafter, the apparatus waits for time T required for reaching a predetermined voltage, and irradiation for the next shot beings.

Upon completion of the irradiation of the previous shot, time required for the next shot to reach the target object is a sum of the following two times. In other words, (i) time T required for a deflected voltage to be stabilized and (ii) time Tb required for the next electron to reach a target object surface through a lens barrel of an electron optics are used.

The latter time Tb is traveling time of an electron (accelerated at 50 kV) for a distance of 1 m between the proximal end of the electron gun assembly to the target object surface, i.e., about 8 ns. Even if the time T for stabilizing a voltage of a deflector is set at 2 ns, the sum T and Tb is 8+2 ns=10 ns. Therefore, a shot cycle (time required for ending the next shot after a certain shot is ended) is 10+2 ns=12 ns. In the conventional technique mentioned in [0024], the shot time is 30 ns, and the stabilizing time of the deflector is 30 ns, so that the shot cycle is 60 ns. In the example mentioned here, shot time and stabilizing time of a deflector are set at 2 ns and 2 ns, respectively, and a total is set at 1/15. However, since the traveling time of the electron is 8 ns, the shot cycle is 12 ns, so that only a shortening effect of 1/5 can be obtained. More specifically, when preparation for the next shot after irradiation of one shot is ended, it is difficult in the system to shorten the waste interval.

FIGS. 3A to 3D are diagrams for explaining proceedings of an electron beam when an electron beam writing method according to the first embodiment is performed. In FIGS. 3A to 3D, states changing with time are shown.

In the charged particle beam writing method mentioned here, a plurality of deflectors arranged on an optical path of the electron beam 200 are used to irradiate a shot of the electron beam 200 while controlling deflection of the electron beam 200. In this manner, a predetermined pattern is written on the target object 101. In the charged particle beam writing method, as shown in FIGS. 3A to 3D, any one of the plurality of deflectors is designed to control deflection of the electron beam 200 of a shot different from a shot which is controlled in deflection by another deflector in the same period. In other words, at least two deflectors of the BLK deflector 212, the shaping deflector 205, and the objective deflector 208 control deflection of charged particle beams of different shots in the same period.

Figure 3:
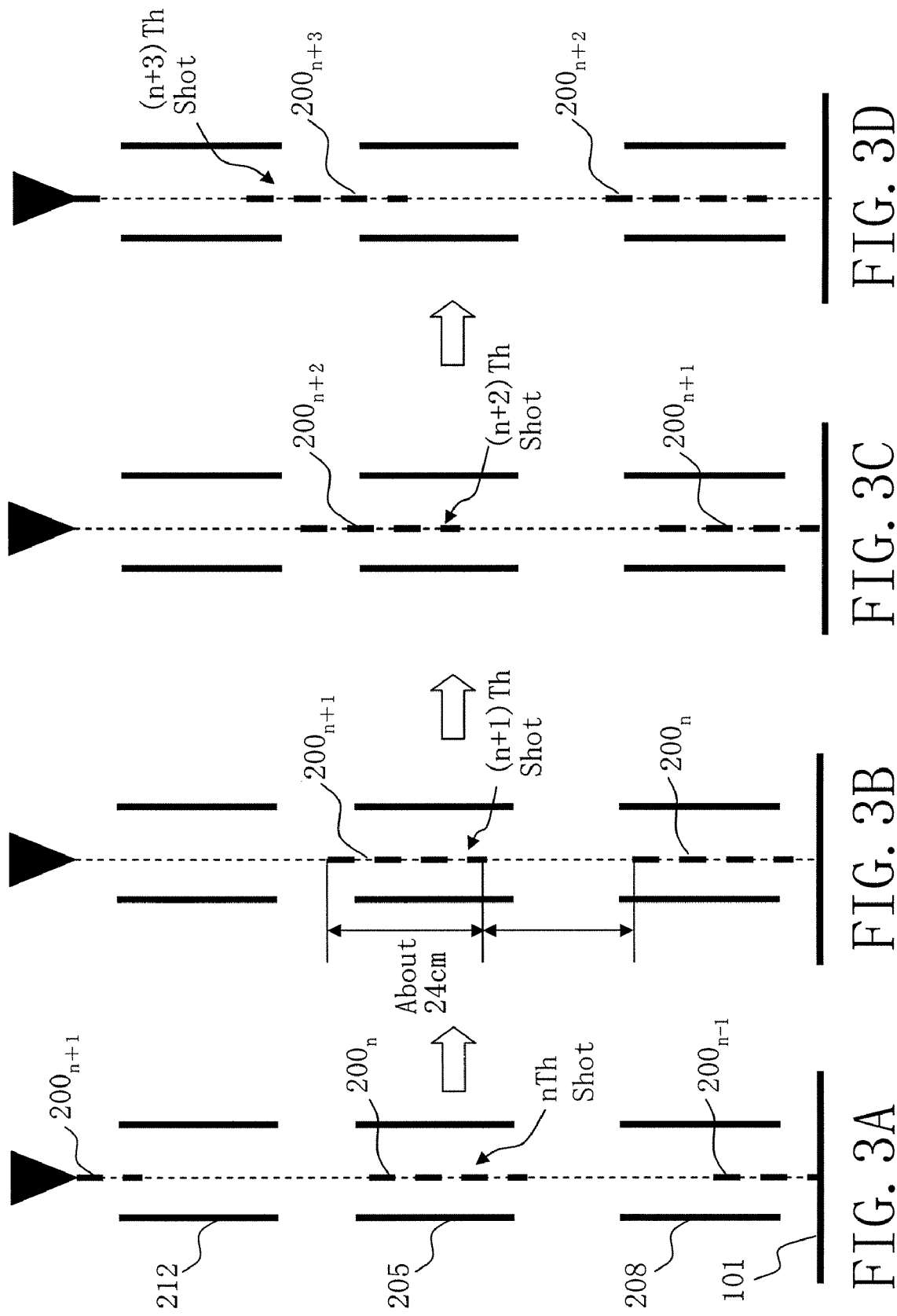
FIGS. 3A to 3D are diagrams for explaining proceedings of an electron beam when an electron beam writing method according to the first embodiment is performed.

More specifically, as shown in FIG. 3A, an (n+1)th shot is irradiated from the electron gun assembly 201 and partially passes through the BLK deflector 212 in the same period in which an nth shot passes while being deflected by the shaping deflector 205. Furthermore, an (n−1)th shot begins to be irradiated on the target object 101, and the remaining is partially deflected by the objective deflector 208. As shown in FIG. 3B, in the same period in which the (n+1)th shot passes while being deflected by the shaping deflector 205, the (n)th shot passes while being deflected by the objective deflector 208. As shown in FIG. 3C, in the same period in which an (n+2)th shot passes while being deflected by the shaping deflector 205, the (n+1)th shot passes while being deflected by the objective deflector 208. As shown in FIG. 3D, in the same period in which an (n+3)th shot begins to be deflected by the shaping deflector 205, the (n+2)th shot passes while being deflected by the objective deflector 208.

The following control is performed to performed the above processes. First, the deflection control circuit 112 inputs positions of the reflecting mirror 209, eventually, position information of the target object 101 from the laser length measuring system 132 at any time or at predetermined intervals. The deflection control circuit 112 distributes deflection signals to the buffer memory 162, the buffer memory 164, and the buffer memory 166. In the distribution mentioned here, on the basis of the position information of the target object 101, signal indicating a time (i.e., time at which a beam-on state is set) at which deflection is turned off is distributed to the BLK deflector 212, and signals (deflection signals) for designating amounts of deflection to be performed are distributed to the shaping deflector 205 and the objective deflector 208 such that a pipeline process can be performed in accordance with movement of the respective shots of the electron beam 200. A signal (data of beam-on time) temporarily stored or "accumulated" in the buffer memory 162 is output to the DAC 152. The DAC 152 adjusts a voltage of the deflecting amplifier 142 such that a beam-on state is kept for time described in the data at a timing (which will be described later). The beam is output to the BLK deflector 212, and the voltage is applied to the BLK deflector 212. Similarly, the signal temporarily stored or "accumulated" in the buffer memory 164 is output to the DAC 154. The DAC 154 digital/analog-converts the data at a timing (which will be described later). The resultant analog voltage signal is output to the deflecting amplifier 144 for only desired time. Then, the analog voltage signal is amplified by the deflecting amplifier 144 and output to the shaping deflector 205 to apply a voltage to the shaping deflector 205. Similarly, the signal temporarily stored or "accumulated" in the buffer memory 166 is output to the DAC 156. The DAC 156 digital/analog-converts the data at a timing (which will be described later). The resultant analog voltage signal is output to the deflecting amplifier 146 for only desired time. The analog voltage signal is amplified by the deflecting amplifier 146 and output to the objective deflector 208 to apply a voltage to the objective deflector 208.

Figure 4:
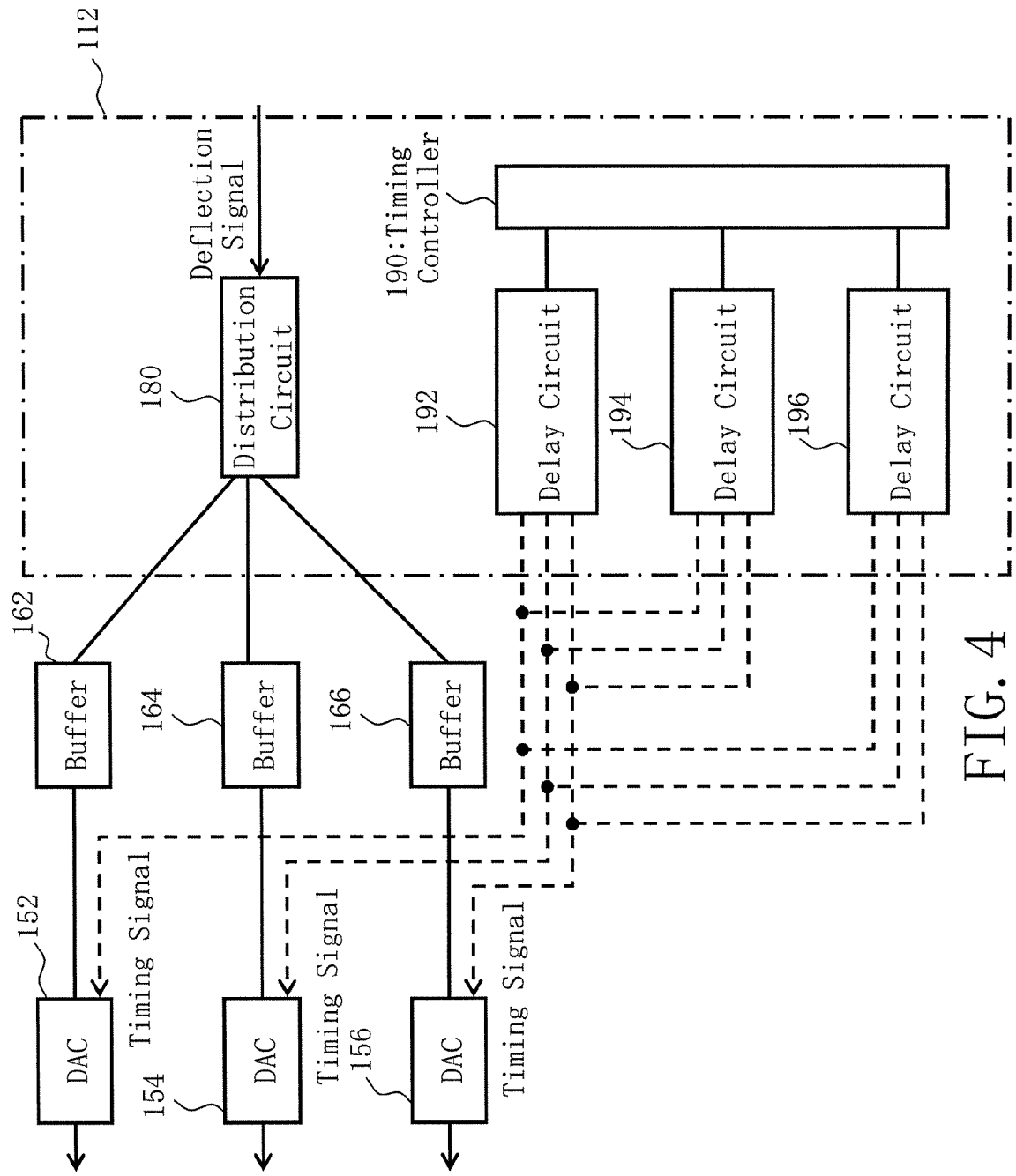
FIG. 4 is a diagram for explaining signal distribution in the first embodiment.

FIG. 4 is a diagram for explaining signal distribution in the first embodiment.

In FIG. 4, the deflection control circuit 112 has a distribution circuit 180, a timing controller 190, and a plurality of delay circuits 192, 194, and 196 (an example of timing signal generating units). The delay circuits 192, 194, and 196 are controlled by the timing controller 190. In the deflection control circuit 112, the distribution circuit 180 distributes deflection signals of, for example, the nth shot to the buffer memory 162, the buffer memory 164, and the buffer memory 166 on the basis of the position information of the target object 101. The timing controller 190 confirms that the deflection signals are distributed to the buffer memories. A signal of a start of operation is output to the delay circuit 192. At this time, the delay circuit 192 transmits a timing signal to the DAC 152 with reference to the nth shot. Predetermined time T1 after, a timing signal is transmitted to the DAC 154. Furthermore, predetermined time T2 after, a timing signal is transmitted to the DAC 156. In this manner, the delay circuit 192 independently generates timing signals for the DACs 154, and the timing signals are transmitted to the respective DACs.

Figure 5:
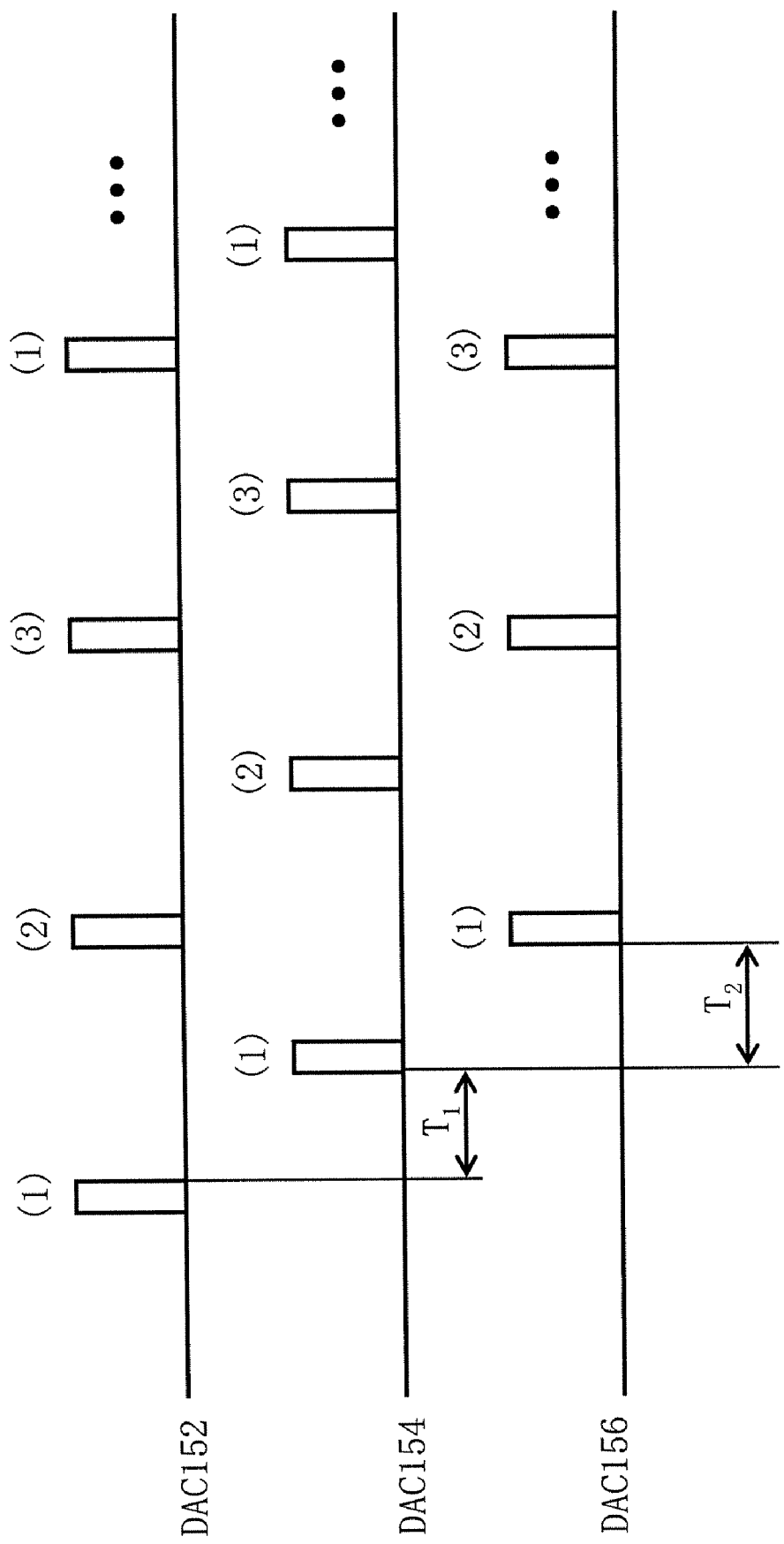
FIG. 5 is a flow chart of a timing signal in the first embodiment.

FIG. 5 is a flow chart of timing signals in the first embodiment.

In this case, for example, the timing signal transmitted by the delay circuit 192 is indicated by (1). For example, a pulse signal is transmitted. When the DAC 152 receives the timing signal, the DAC 152 outputs an analog voltage signal for setting a beam-on state to the deflecting amplifier 142 for time (beam-on time) of the data received through the buffer memory 162. In this manner, the DAC 152 (an example of a voltage applying unit) applies a voltage to the BLK deflector 212 through the deflecting amplifier 142. A deflection signal which is completely output to the DAC 152 is erased from the buffer memory 162. After the DAC 152 set a beam-on state for designated time, a voltage for setting a beam-off state is automatically generated, and the BLK deflector is controlled through the amplifier to set the beam-off state.

When the DAC 154 receives a timing signal time T1 after, the DAC 154 digital/analog-converts the deflection signal received through the buffer memory 164 as described above. The DAC 154 outputs the analog voltage signal to the deflecting amplifier 144. In this manner, the DAC 154 (an example of an voltage applying unit) applies a voltage to the shaping deflector 205 through the deflecting amplifier 144. The deflection signal which is completely output to the DAC 154 is erased from the buffer memory 164.

Similarly, when the DAC 156 receives a timing signal time T2 after, the DAC 156 digital/analog-converts the deflection signal received through the buffer memory 166 as described above. The DAC 156 outputs the analog voltage signal to the deflecting amplifier 146. In this manner, the DAC 156 (an example of an voltage applying unit) applies a voltage to the objective deflector 208 through the deflecting amplifier 146. The deflection signal which is completely output to the DAC 156 is erased from the buffer memory 166.

Meanwhile, the distribution circuit 180 distributes deflection signals about the (n+1)th shot to the buffer memory 162, the buffer memory 164, and the buffer memory 166. The timing controller 190 confirms that the deflection signals have been distributed to the respective buffer memories. Thereafter, a signal of a start of operation is output to the delay circuit 194. At this time, the delay circuit 194 transmits a timing signal to the DAC 152 with respect to this shot. The predetermined time T1 after, the delay circuit 194 transmits a timing signal to the DAC 154. The predetermined time T2 after, the delay circuit 194 transmits a timing signal to the DAC 154. Furthermore, the predetermined time T2 after, the delay circuit 194 transmits a timing signal to the DAC 156. In FIG. 5, the timing signal transmitted by the delay circuit 194 is indicated by (2). By the same manner as described above, the deflection signals are processed to control deflection of the (n+1)th shot.

The distribution circuit 180 distributes deflection signals about an (n+2)th shot to the buffer memory 162, the buffer memory 164, and the buffer memory 166. The timing controller 190 confirms that the deflection signals have been distributed to the respective buffer memories. Thereafter, a signal of a start of operation is output to the delay circuit 196. At this time, the delay circuit 196 transmits a timing signal to the DAC 152 with respect to this shot. The predetermined time T1 after, the delay circuit 196 transmits a timing signal to the DAC 154. The predetermined time T2 after, the delay circuit 196 transmits a timing signal to the DAC 156. In FIG. 5, the timing signal transmitted by the delay circuit 196 is indicated by (3). By the same manner as described above, the deflection signals are processed to control deflection of the (n+2)th shot.

In this case, as shown in FIG. 5, it is also supposed that the timing signal to the DAC 156 with respect to the nth shot and the timing signal to the DAC 152 with respect to the (n+1)th shot are simultaneously output. At this time, the electron cannot be controlled by only one delay circuit. In contrast to this, in the first embodiment, the plurality of delay circuits 192, 194, and 196 are arranged to cope with a case in which output timings overlap.

Figure 6:
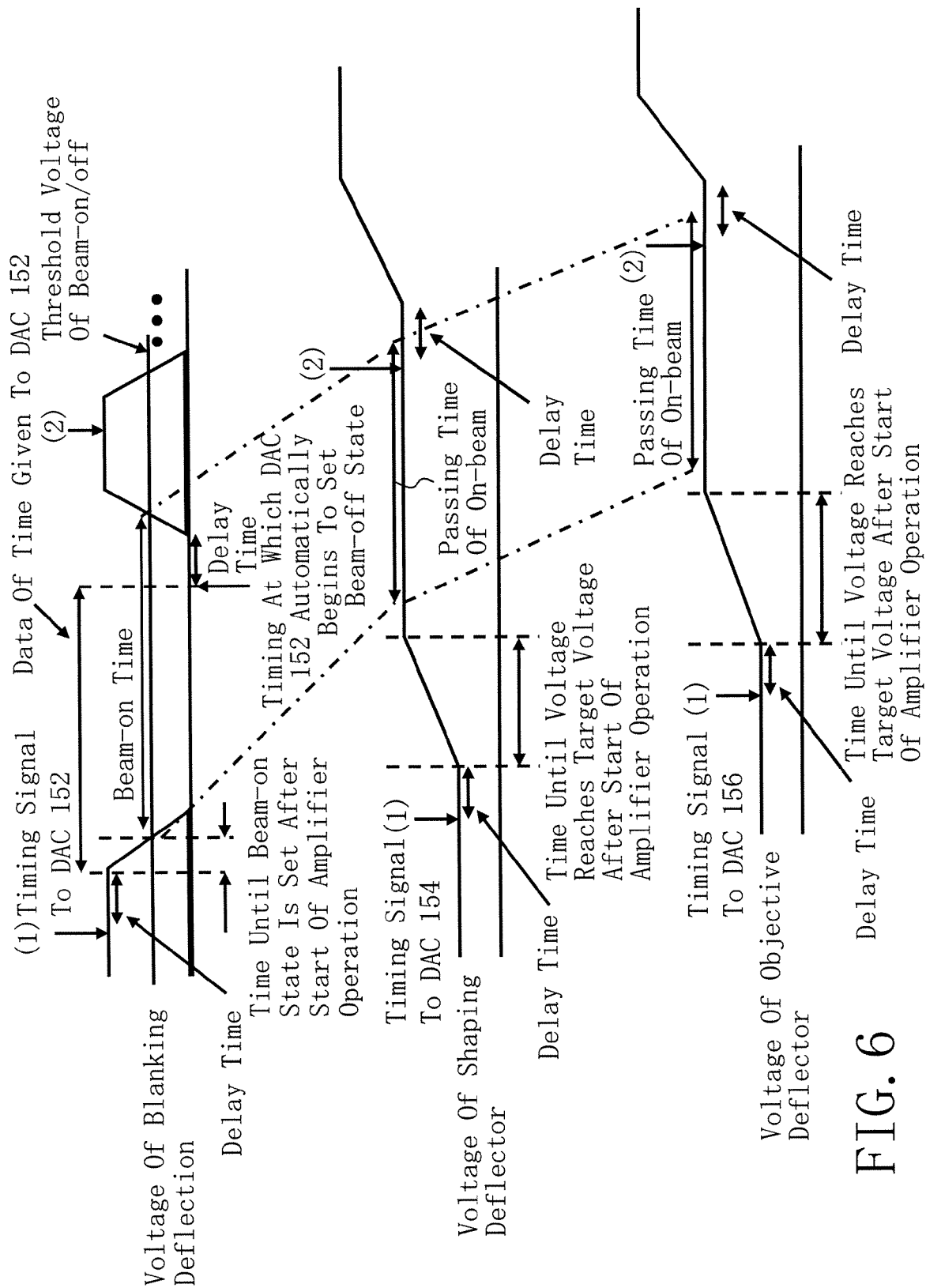
FIG. 6 is a diagram showing control of deflectors and changes in voltage with respect to one shot.

In this case, for example, delay time T1 can be calculated as follows. A value obtained by dividing a distance between a blanking deflector and a shaping deflector by a velocity of an electron beam is given by t0. A value obtained by dividing a distance between a delay circuit and the DAC 154 by a signal velocity of a timing signal is given by t1. A value obtained by dividing a distance between the delay circuit and the DAC 152 by a signal velocity of a timing signal is given by t2. Electric circuit delay time on an output side toward the DAC 154 in the delay circuit is given by t3. Dielectric circuit delay time on an output side toward the DAC 152 in the delay circuit is given by t4. Time between signal reception of the DAC 154 and an operation of the deflector is given by t5. Time from signal reception of the DAC 152 and the operation of the deflector is given by t6. Time until voltage of deflector 205 reaches target voltage after start of amplifier operation is given by t7. Time until voltage of deflector 212 reaches target voltage after start of amplifier operation is given by t8. In this conditions, the delay time T1 can be calculated by T1=t0−t1+t2−t3+t4−t5+t6−t7+t8. The time T2 may be similarly calculated such that the DAC 154, the DAC 152, the blanking deflector, and the shaping deflector are replaced with the DAC 156, the DAC 154, the shaping deflector, and the objective deflector or "position deflector", respectively. FIG. 6 shows control of the deflectors and changes in voltage with respect to one shot. On the blanking deflector side, after reception of a timing signal, delay occurs in a digital circuit. Thereafter, a voltage of the blanking deflector begins to increase and reaches a predetermined voltage, a beam begins to be on. Predetermined time after, a voltage for setting a beam-off state begins to be applied. As time designated by the DAC 152, time calculated in consideration of these delay times and the like is set. Similarly, in the shaping deflector, after reception of a timing signal, delay time in a digital circuit or the like is generated. Thereafter, a voltage of the deflector increases and reaches a predetermined voltage. Thereafter, a beam to be on passes. On the contrary, after the shaping deflector has the predetermined voltage, the timing of the time T1 may be adjusted such that the on-beam passes through the shaping deflector. Unlike in the case of the blanking deflector, the voltage is not automatically changed even after the on-beam passes, the apparatus waits the next timing signal. The deflector related to a position performs the same operation as that of the shaping deflector. The above explanation is made such that rise times of the blanking deflector, the shaping deflector, and the position deflector are almost equal to each other. Depending on systems, the rise times are different from each other, and the rise times of the shaping deflector and the position deflector may be longer than the rise time of the blanking deflector. In such a case, the timing signals are transmitted to the DACs of the shaping deflector and the position deflector first, and the timing signal may be transmitted to the DAC of the blanking deflector.

As described above, preparation for the next shot is not performed upon completion of irradiation of one shot, and preparation for the next shot is performed immediately after the electron beam passes through its own deflector. With this operation, preparation for a deflecting amplifier can be rapidly started, and settling time can be shortened. As a result, any one of the plurality of deflectors can control deflection of a charged particle beam of a shot different from a shot which is controlled in deflection by another deflector in the same period. Therefore, deflection of a plurality of shots can be controlled in the same period. The BLK deflector 212, the shaping deflector 205, and the objective deflector 208 perform a pipeline process to make it possible to perform shots in succession. Consequently, in comparison with a conventional method in which preparation for the next step is performed upon completion of irradiation of one shot, irradiation of the next shot can be more rapidly performed. As a result, writing time can be shortened. For example, as described above, the current density of the electron beam 200 is increased to shorten irradiation time, and irradiation time of one shot is set at 2 ns. In this case, an electron beam length can be made short, i.e., about 24 cm. When the pipeline process is performed, an interval (beam-off interval) between the end of the nth shot and the start of the (n+1)th shot can be shortened to about 24 cm. Time until voltage of deflector 205 (and 208) reaches target voltage after starting the amplifier operation depends on the difference between initial voltage and target voltage. So, the value of T1 (and T2) must be controlled shot by shot. There is a case that the time until voltage of deflector 205 (and 208) reaches target voltage after starting the amplifier operation is much larger than the Time until voltage of blanking deflector reaches target voltage after starting the amplifier operation. In such a case, T1 (T2) becomes less than zero. Then the signal should be sent to shaping deflector sub-system before the signal is sent to blanking deflector sub-system.

Second Embodiment

Figure 7:
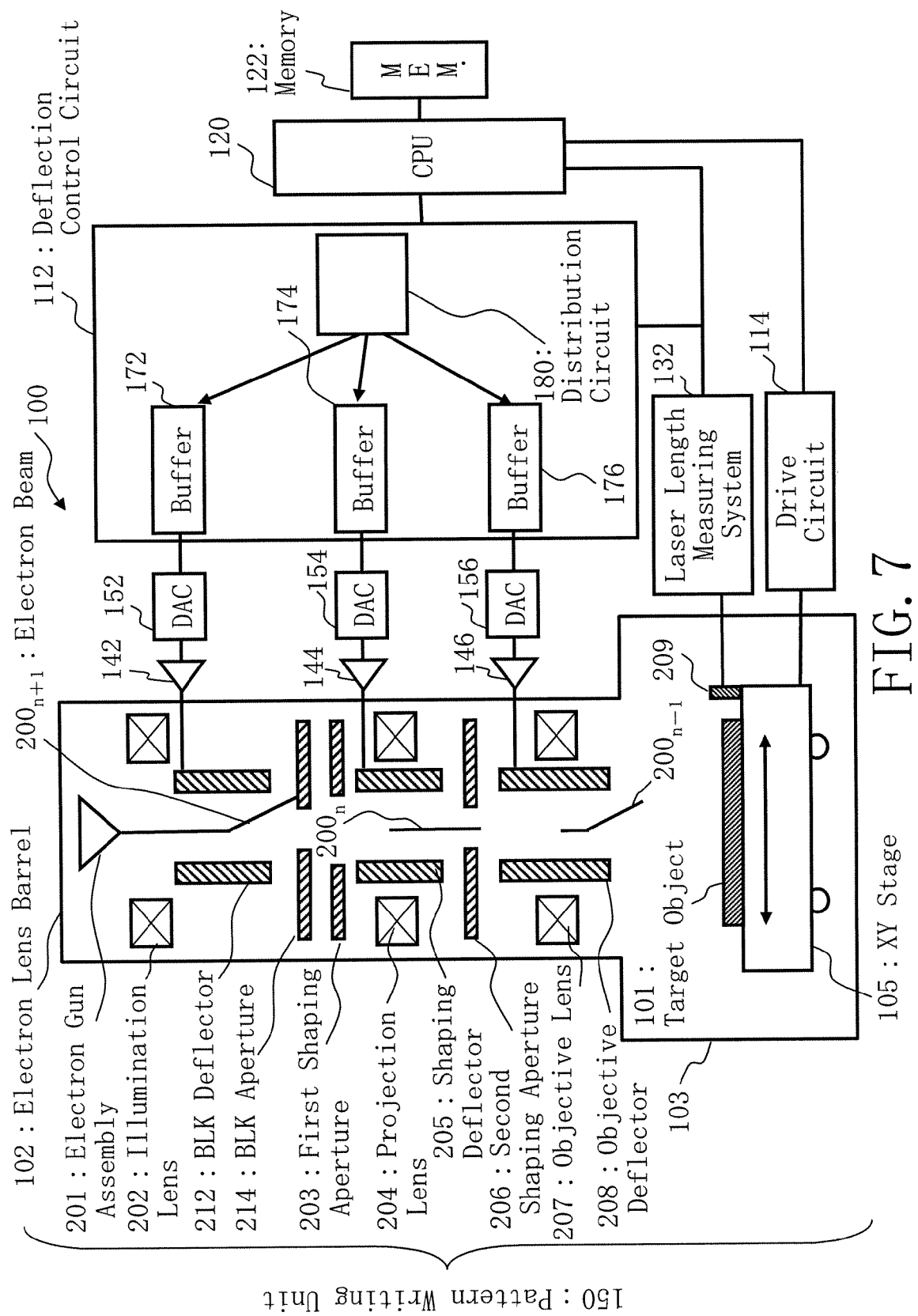
FIG. 7 is a conceptual diagram showing a configuration of a writing apparatus according to a second embodiment.

FIG. 7 is a conceptual diagram showing a configuration of a writing apparatus according to a second embodiment.

FIG. 7 is the same as FIG. 1 except that a buffer memory 172, 174, and 176 are arranged in a deflection control circuit 112. In FIG. 7, a distribution circuit 180 which is omitted in FIG. 1 is shown. The DAC 152 is connected to the buffer memory 172. Similarly, the DAC 154 is connected to the buffer memory 174. Similarly, the DAC 156 is connected to the buffer memory 176. In the first embodiment, the respective buffer memories are arranged on respective deflector sides serving as receiving sides of output signals from the deflection control circuit 112. However, the second embodiment is the same as the first embodiment except that the buffer memories are arranged in the deflection control circuit 112 and arranged on sending sides to the deflectors. In FIG. 7, constituent elements required for explaining the second embodiment are described. In general, a writing apparatus 100 includes other necessary components as a matter of course.

In the second embodiment, the distribution circuit 180 in the deflection control circuit 112 distributes signals to the buffer memory 172, 174, and 176 in the deflection control circuit 112. As in the first embodiment, this distribution is also performed such that signals for designating amounts of deflection to be performed by the deflectors of the BLK deflector 212, the shaping deflector 205, and the objective deflector 208 can be subjected to a pipeline process in accordance with movement of respective shots of the electron beam 200 on the basis of position information of the target object 101. The other configurations, control method, and writing method are the same as those in the first embodiment. Control of the timing signals is also performed by the same method as that in the first embodiment.

As described above, even though the buffer memories which accumulate deflection signals to the deflectors are arranged on a sending side, as in the first embodiment, any one of the plurality of deflectors can perform a pipeline process while controlling deflection of the electron beam 200 of a shot different from a shot which is controlled in deflection by another deflector in the same period. Therefore, writing time can be shortened.

Third Embodiment

Figure 8:
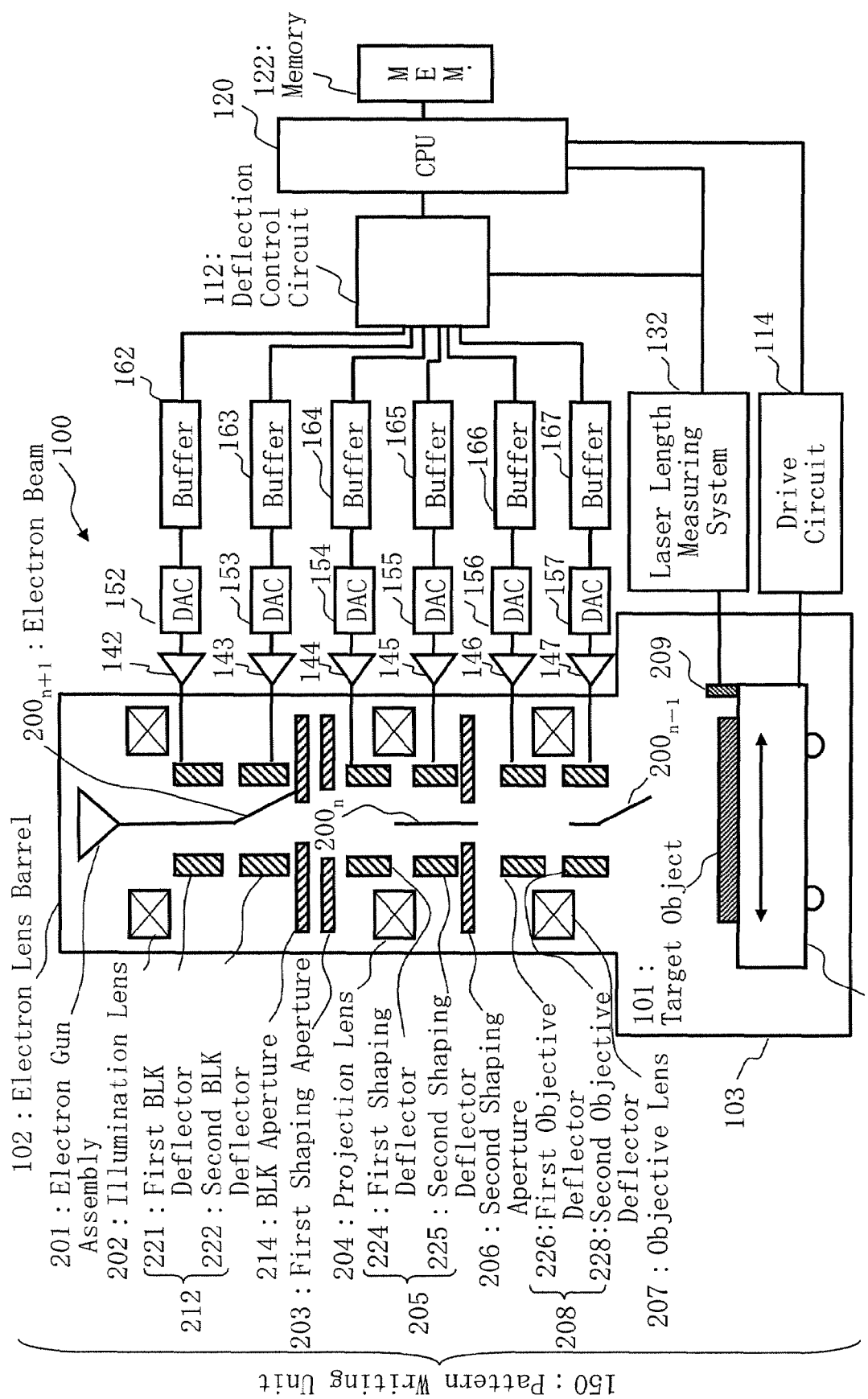
FIG. 8 is a conceptual diagram showing a configuration of a writing apparatus according to a third embodiment.

FIG. 8 is a conceptual diagram showing a configuration of a writing apparatus according to a third embodiment.

In FIG. 8, a writing apparatus 100 includes, as an example of a pattern writing unit 150, an electron lens barrel 102, a writing chamber 103, an X-Y stage 105, an electron gun assembly 201, an illumination lens 202, a first BLK deflector 221, a second BLK deflector 222, a BLK aperture 214, a first shaping aperture 203, a projection lens 204, a first shaping deflector 224, a second shaping deflector 225, a second shaping aperture 206, an objective lens 207, a first objective deflector 226, a second objective deflector 228, and a reflecting mirror 209. The writing apparatus 100 includes, as a control system, a CPU 120, a memory 122, a deflection control circuit 112, a laser length measuring system 132, a drive circuit 114, a deflecting amplifier 142, a DAC 152, a buffer memory 162, a deflecting amplifier 143, a DAC 153, a buffer memory 163, a deflecting amplifier 144, a DAC 154, a buffer memory 164, a deflecting amplifier 145, a DAC 155, a buffer memory 165, a deflecting amplifier 146, a DAC 156, a buffer memory 166, a deflecting amplifier 147, a DAC 157, and a buffer memory 167.

The electron gun assembly 201, the illumination lens 202, the first BLK deflector 221, the second BLK deflector 222, the BLK aperture 214, the first shaping aperture 203, the projection lens 204, the first shaping deflector 224, the second shaping deflector 225, the second shaping aperture 206, the objective lens 207, the first objective deflector 226, and the second objective deflector 228 are arranged in the electron lens barrel 102. In the writing chamber 103, the X-Y stage 105 is arranged. On the X-Y stage 105, the reflecting mirror 209 for measuring a laser length is arranged.

The first BLK deflector 221 and the second BLK deflector 222 transmit the electron beam 200 without deflecting the electron beam 200 to set a beam-on state, and deflect the electron beam 200 to set a beam-off state. The first BLK deflector 221 and the second BLK deflector 222 serve as deflectors having a plurality of stages obtained by dividing the BLK deflector 212 having a deflector length to cause an electron to obtain a predetermined amount of deflection for blanking in a plurality of stages. In this case, as an example, the first BLK deflector 221 and the second BLK deflector 222 obtained by dividing the BLK deflector 212 in two stages are shown. The number of divided stages may be three or more. The divided deflectors are arranged to have shapes separated from one another.

The first shaping deflector 224 and the second shaping deflector 225 are respectively arranged behind the first BLK deflector 221 and the first shaping deflector 224 on optical paths to deflect and shape the electron beam 200. The first shaping deflector 224 and the second shaping deflector 225 serve as deflectors of a plurality of stages obtained by dividing the shaping deflector 205 having a deflector length to cause an electron to obtain a predetermined amount of deflection for shaping in a plurality of stages. In this case, as an example, the first shaping deflector 224 and the second shaping deflector 225 obtained by dividing the shaping deflector 205 in two stages are shown. The number of divided stages may be three or more. The divided deflectors are arranged to have shapes separated from one another.

The first objective deflector 226 and the second objective deflector 228 are arranged behind the first shaping deflector 224 and the second shaping deflector 225 on optical paths to deflect the electron beam 200 to a predetermined position of the target object 101. The first objective deflector 226 and the second objective deflector 228 serve as deflectors of a plurality of stages obtained by dividing the objective deflector 208 having a deflector length to cause an electron to obtain a predetermined amount of deflection for deflection to the predetermined position of the target object 101 in a plurality of stages. In this case, as an example, the first objective deflector 226 and the second objective deflector 228 obtained by dividing the objective deflector 208 in two stages are shown. The number of divided stages may be three or more. The divided deflectors are arranged to have shapes separated from one another.

The memory 122, the deflection control circuit 112, the laser length measuring system 132, and the drive circuit 114 are connected to the CPU 120 through a bus (not shown). The deflection control circuit 112 and the drive circuit 114 are controlled by the CPU 120. Information, an arithmetic operation result, and the like input to the CPU 120 are stored (memorized) in the memory 122. The laser length measuring system 132, the buffer memory 162, the buffer memory 163, the buffer memory 164, the buffer memory 165, the buffer memory 166, and the buffer memory 167 are further connected to the deflection control circuit 112 through a bus (not shown).

The DAC 152 is connected to the buffer memory 162, the deflecting amplifier 142 is connected to the DAC 152, and the deflecting amplifier 142 is connected to the first BLK deflector 221. The DAC 153 is connected to the buffer memory 163, the deflecting amplifier 143 is connected to the DAC 153, and the deflecting amplifier 143 is connected to the second BLK deflector 222.

Similarly, the DAC 154 is connected to the buffer memory 164, the deflecting amplifier 144 is connected to the DAC 154, and the deflecting amplifier 144 is connected to the first shaping deflector 224. The DAC 155 is connected to the buffer memory 165, the deflecting amplifier 145 is connected to the DAC 155, and the deflecting amplifier 145 is connected to the second shaping deflector 225.

Similarly, the DAC 156 is connected to the buffer memory 166, the deflecting amplifier 146 is connected to the DAC 156, and the deflecting amplifier 146 is connected to the first objective deflector 226. The DAC 157 is connected to the buffer memory 167, the deflecting amplifier 147 is connected to the DAC 157, and the deflecting amplifier 147 is connected to the second objective deflector 228.

The first BLK deflector 221 is controlled by the deflection control circuit 112 serving as an example of a voltage applying unit, the buffer memory 162, the DAC 152, and the deflecting amplifier 142 and applied with a voltage. The second BLK deflector 222 is controlled by the deflection control circuit 112 serving as an example of the voltage applying unit, the buffer memory 163, the DAC 153, and the deflecting amplifier 143 and applied with a voltage. The first shaping deflector 224 is controlled by the deflection control circuit 112 serving as an example of the voltage applying unit, the buffer memory 164, the DAC 154, and the deflecting amplifier 144 and applied with a voltage. The second shaping deflector 225 is controlled by the deflection control circuit 112 serving as an example of the voltage applying unit, the buffer memory 165, the DAC 155, and the deflecting amplifier 145 and applied with a voltage. The first objective deflector 226 is controlled by the deflection control circuit 112 serving as an example of the voltage applying unit, the buffer memory 166, the DAC 156, and the deflecting amplifier 146 and applied with a voltage. The second objective deflector 228 is controlled by the deflection control circuit 112 serving as an example of the voltage applying unit, the buffer memory 167, the DAC 157, and the deflecting amplifier 147 and applied with a voltage.

In FIG. 8, constituent parts required for explaining the third embodiment are described. In general, the writing apparatus 100 includes other necessary components as a matter of course. FIG. 8 is the same as FIG. 1 except that multistage deflectors are used and the deflecting amplifier, the DAC, and the buffer memory which control the multistage deflectors are added. In the deflection control circuit 112, a timing controller for controlling a timing and a plurality of delay circuits are arranged and similarly controlled as in the first embodiment.

FIGS. 9A to 9E are diagrams for explaining manners of an electron passing through deflectors which are not multistaged. In FIGS. 9A to 9E show states changing with time.

As described above, a current density of a charged particle beam is increased to shorten a beam length of 1 shot, so that a plurality of shots can be traveled in the writing apparatus in the same period. However, when the plurality of shots can travel in the writing apparatus to shorten a shot interval, it is time to prepare deflection of the next shot while an electron is deflected by the deflectors in some cases, and the electron may be uncontrollable during the deflection. This will be concretely described below with reference to drawings.

FIG. 9A shows a state in which original voltages "+V'" and "−V'" are applied to opposite electrodes. From this state, voltages are changed such that voltages "+V" and "−V" as shown in FIG. 9B are applied to opposite electrodes of the deflector in order to deflect the next electron. FIG. 9C shows a state in which an electron is injected in a state in which the voltages "+V" and "−V" are applied to opposite electrodes of the deflector. When the electron is passing through the deflector as shown in FIG. 9D, the electron is deflected by the deflection voltages "+V" and "−V". However, as shown in FIG. 9E, when the electron does not completely pass through the deflector, it is time to perform preparation for deflection of the next shot, and voltage changes from the voltages "+V" and "−V" to the voltages "+V''" and "−V''" are started. For this reason, the electron is not deflected to a desired position, and the electron is uncontrollable.

In the embodiment, voltages are independently applied from the deflection control circuit 112, corresponding DACs, corresponding deflecting amplifiers to the deflectors of the plurality of stages in accordance with movement of the electron by using deflectors of a plurality of stages obtained by dividing a deflector to cause an electron to obtain a predetermined amount of deflection in a plurality of stages. This operation will be concretely described below with reference to drawings.

FIGS. 10A to 10E are diagrams for explaining a deflecting method according to the third embodiment. FIGS. 10A to 10E show states changing with time.

Figures 10A, 10B, 10C, 10D, 10E:
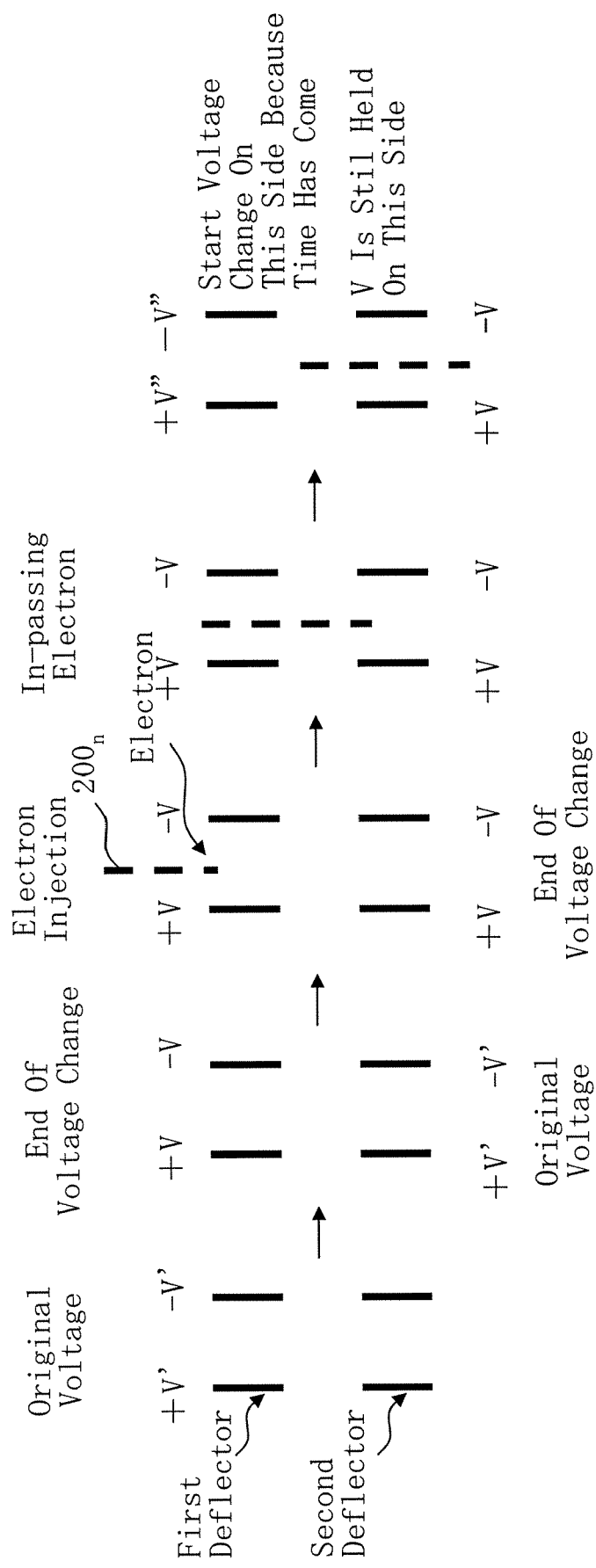
FIGS. 10A to 10E are diagrams for explaining a deflecting method according to the third embodiment.

FIG. 10A shows a state in which original voltages "+V'" and "−V'" are applied to opposite electrodes of the first deflector on the upper stage. From this state, voltages are changed such that voltages "+V" and "−V" as shown in FIG. 10B are applied to opposite electrodes of the first deflector on the upper stage in order to deflect an electron beam 200n of the next shot. Voltages are changed such that the original voltages "+V" and "−V" applied to the first deflector on the upper stage are applied to opposite electrodes of the second deflector on the lower stage. FIG. 10C shows a state in which the electron beam 200n is injected into the first deflector on the upper stage in the state the voltages "+V" and "−V" are applied to the opposite electrodes of the first deflector on the upper stage. While the electron beam 200n passes through the first deflector on the upper stage, the voltages "+V'" and "−V'" applied to the second deflector on the lower stage are changed into the voltages "+V" and "−V" to deflect the electron beam 200n in deflection by the first deflector on the upper stage. As a result, as shown in FIG. 10D, deflection of a desired amount of deflection can be achieved even through the electron beam 200n is injected into the second deflector on the lower stage. Furthermore, as shown in FIG. 10E, the electron beam 200n completely passes through the first deflector on the upper stage even though the electron beam 200n passes through the second deflector on the lower stage. When it is time to perform preparation for deflection of the next shot, voltage changes from the voltages "+V" and "−V" applied to the first deflector on the upper stage into voltages "+V''" and "−V''" to deflect an electron beam 200n+1 of the next shot are started. In the second deflector on the lower stage, the voltages "+V" and "−V" are maintained since the electron beam 200n passes through the second deflector.

In FIGS. 10A to 10E, the deflectors having one certain deflecting function are described. However, as shown in FIG. 8, the first BLK deflector 221 and the second BLK deflector 222 desirably similarly perform deflection control, the first shaping deflector 224 and the second shaping deflector 225 desirably similarly perform deflection control, and the first objective deflector 226 and the second objective deflector 228 desirably similarly perform deflection control.

As described above, by using deflectors of a plurality of stages obtained by dividing a deflector to cause an electron to obtain a predetermined amount of deflection in a plurality of stages, voltages are independently applied to the deflectors of the plurality of stages in accordance with movement of the electron to perform a pipeline process, so that a deflector through which the electron has passed can be started to perform preparation for the next deflection. Therefore, uncontrollability during deflection can be avoided, and settling time can be shortened. In this manner, shot time and waiting time between shots can be shortened. As a consequence, writing time can be shortened accordingly.

In this case, as deflector lengths of the deflectors of the plurality of stages are obtained by dividing a deflector length to cause electrons in the electron beam 200 to obtain predetermined amounts of deflection into the plurality of stages. However, the present invention is not limited to the deflector lengths. Deflectors having lengths shorter than the deflector length to obtain the predetermined amount of deflection may be preferably combined to each other on many stages.

Fourth Embodiment

Figure 11:
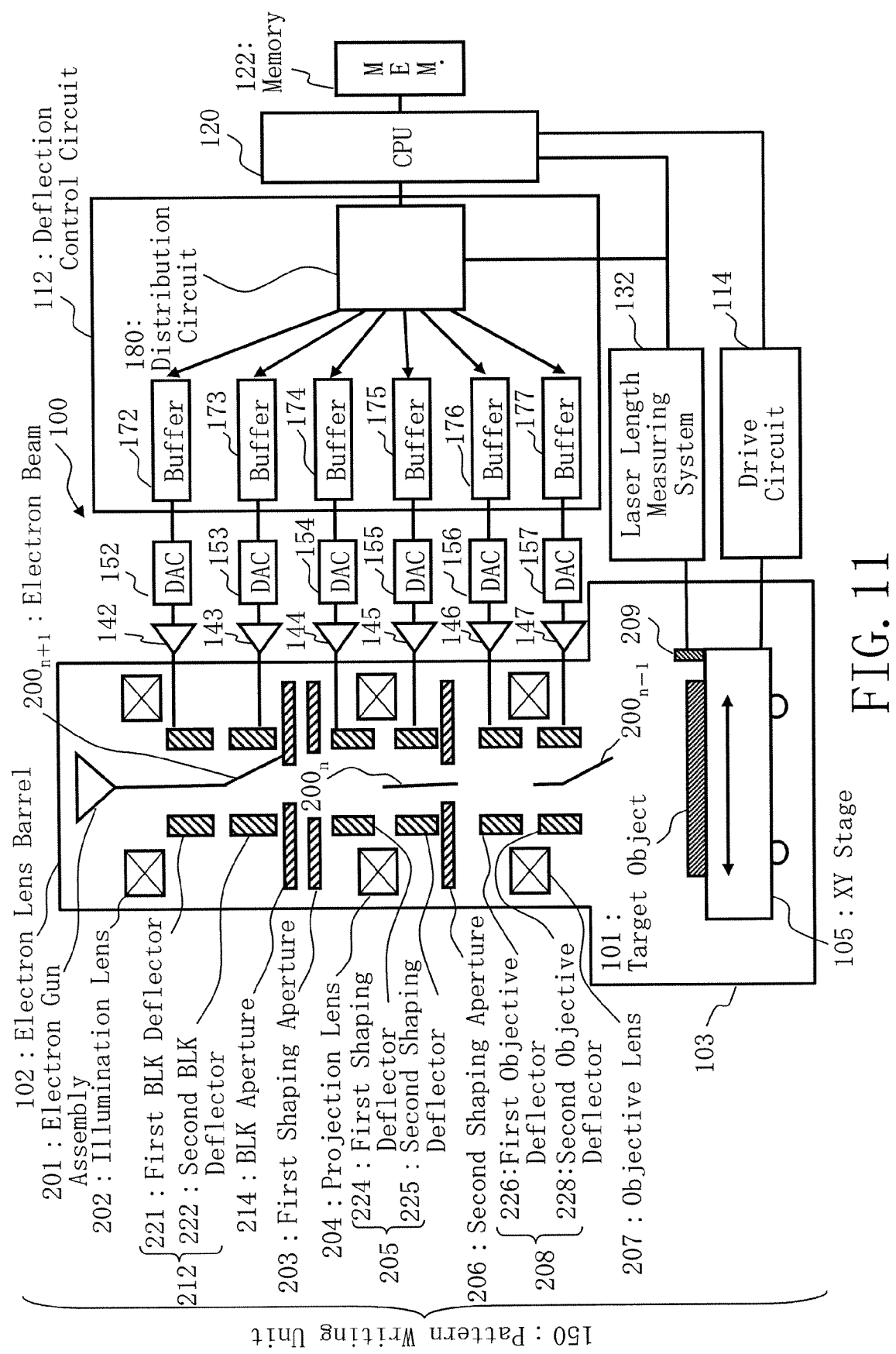
FIG. 11 is a conceptual diagram showing a configuration of a writing apparatus according to a fourth embodiment.

FIG. 11 is a conceptual diagram showing a configuration of a writing apparatus according to a fourth embodiment.

In FIG. 11, in place of the buffer memories arranged outside the deflection control circuit 112 in FIG. 8, a buffer memory 172, a buffer memory 173, a buffer memory 174, a buffer memory 175, a buffer memory 176, and a buffer memory 177 are arranged in the deflection control circuit 112. In FIG. 11, a distribution circuit 180 which is omitted in FIG. 8 is described. Other configurations are the same as those in FIG. 8.

A DAC 152 is connected to the buffer memory 172, and a DAC 153 is connected to the buffer memory 173. Similarly, a DAC 154 is connected to the buffer memory 174. A DAC 155 is connected to the buffer memory 175. Similarly, a DAC 156 is connected to the buffer memory 176. A DAC 157 is connected to the buffer memory 177.

In the third embodiment, the buffer memories are arranged on deflector sides serving as receiving sides of output signals from the deflection control circuit 112. However, in the fourth embodiment, the buffer memories are arranged in the deflection control circuit 112 and arranged on sending sides to the deflectors. Except for this configuration, FIG. 11 is the same as FIG. 8. In FIG. 11, constituent parts required for explaining the fourth embodiment are described. In general, a writing apparatus 100 includes other necessary components as a matter of course.

In the fourth embodiment, the distribution circuit 180 in the deflection control circuit 112 distributes signals to the buffer memory 172, the buffer memory 173, the buffer memory 174, the buffer memory 175, the buffer memory 176, and the buffer memory 177 in the deflection control circuit 112. In this distribution, signals (deflection signals) for designating amounts of deflection to be performed by the deflectors of a first BLK deflector 221, a second BLK deflector 222, a first shaping deflector 224, a second shaping deflector 225, a first objective deflector 226, and a second objective deflector 228 on the basis of position information of a target object 101 are distributed such that a pipeline process can be performed in accordance with movement of the shots of the electron beam 200.

A signal temporarily accumulated in the buffer memory 172 is output to the DAC 152 at a desired timing. The DAC 152 applies a voltage to the first BLK deflector 221 at a desired timing through a deflecting amplifier 142. A signal temporarily accumulated in the buffer memory 173 is output to the DAC 153 at a desired timing. The DAC 153 applies a voltage to the second BLK deflector 222 at a desired timing through a deflecting amplifier 143.

Similarly, a signal temporarily accumulated in the buffer memory 174 is output to the DAC 154 at a desired timing. The DAC 154 applies a voltage to the first shaping deflector 224 at a desired timing through a deflecting amplifier 144. A signal temporarily accumulated in the buffer memory 175 is output to the DAC 155 at a desired timing. The DAC 155 applies a voltage to the second shaping deflector 225 at a desired timing through a deflecting amplifier 145.

Similarly, a signal temporarily accumulated in the buffer memory 176 is output to the DAC 156 at a desired timing. The DAC 156 applies a voltage to the first objective deflector 226 at a desired timing through a deflecting amplifier 146. A signal temporarily accumulated in the buffer memory 177 is output to the DAC 157 at a desired timing. The DAC 157 applies a voltage to the second objective deflector 228 at a desired timing through a deflecting amplifier 147.

The other configurations, control method, and writing method are the same as those in the third embodiment.

As described above, even though the buffer memories which measure timings for applying voltages to deflectors are arranged on sending sides, independent voltages are applied to the deflectors of the plurality of stages in accordance with movement of the electron, so that a pipeline process can be performed, as in the third embodiment, by using deflectors of a plurality of stages obtained by dividing a deflector to cause an electron to obtain a predetermined amount of deflection in a plurality of stages. When the pipeline process is performed, a deflector through which the electron has passed can be started to perform preparation for the next deflection. Therefore, uncontrollability during deflection can be avoided, and settling time can be shortened.

Fifth Embodiment

Figure 12:
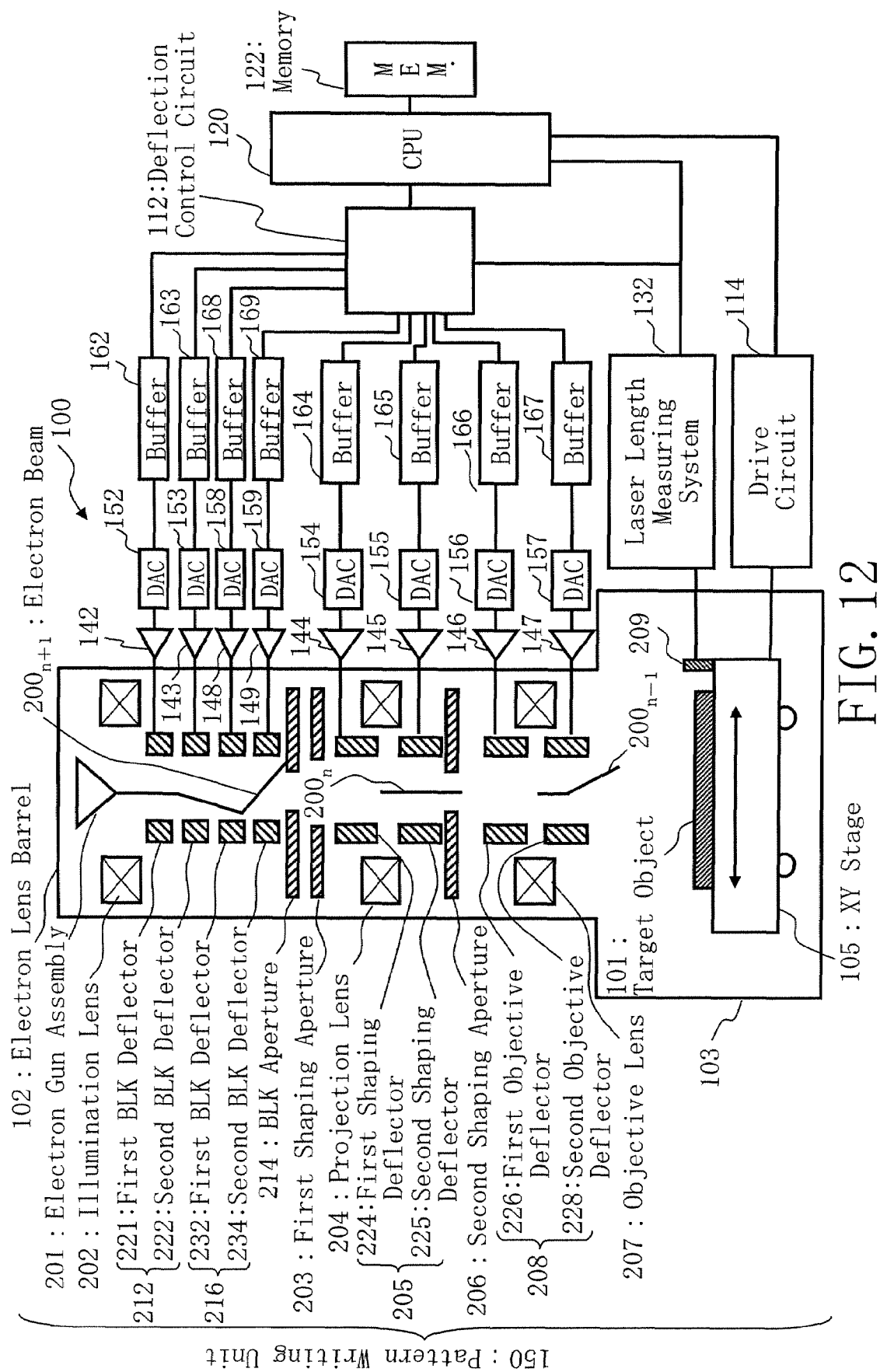
FIG. 12 is a conceptual diagram showing a configuration of a writing apparatus according to a fifth embodiment.
Figure 13:
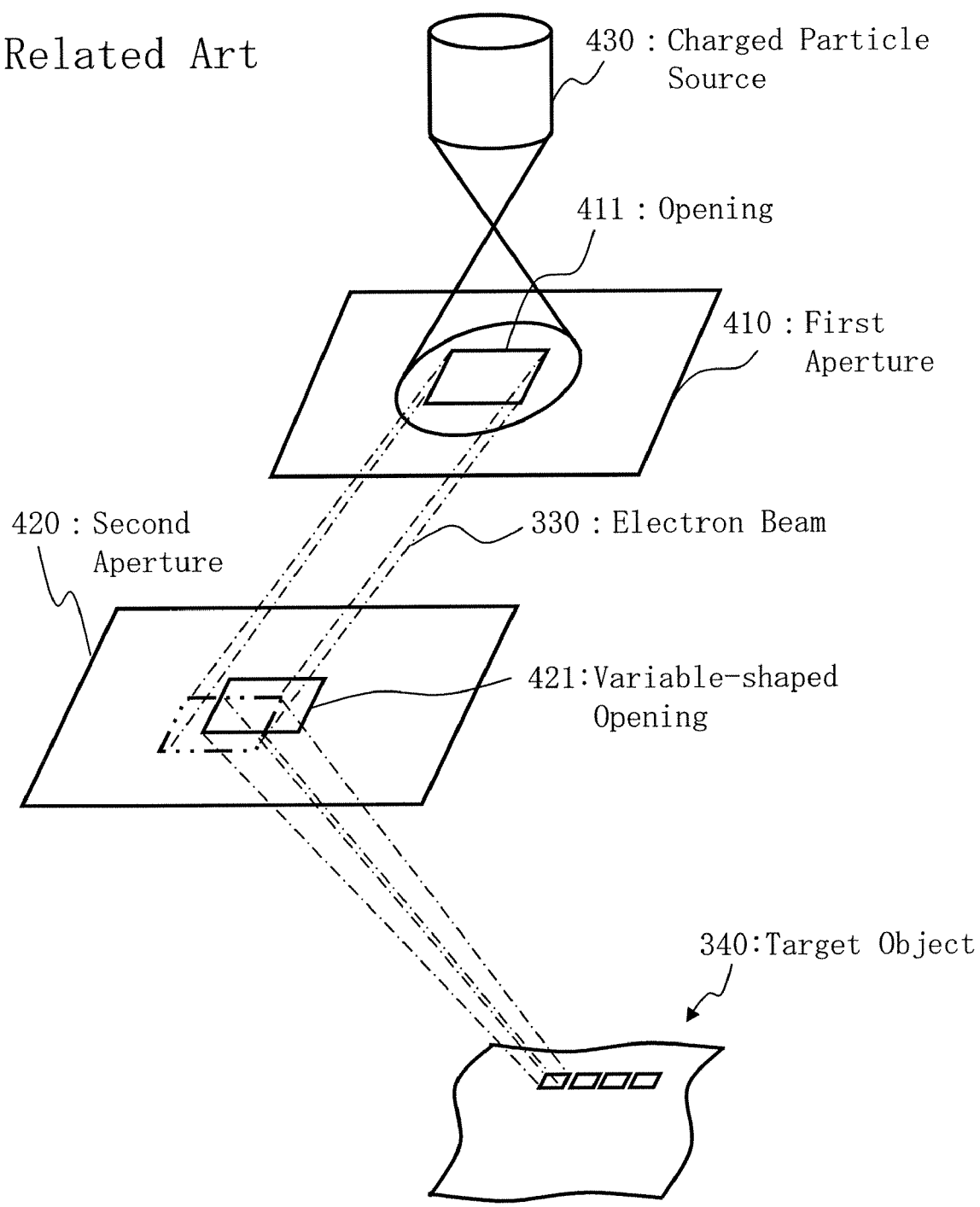
FIG. 13 is a conceptual view for explaining an operation of a conventional variable-shaped electron beam writing apparatus.

FIG. 12 is a conceptual diagram showing a configuration of a writing apparatus according to a fifth embodiment.

In the fifth embodiment, description will be given to a configuration obtained by adding one set of blanking deflection mechanism to the configuration of the third embodiment. More specifically, a first BLK deflector 232 and a second BLK deflector 234 are arranged behind the first BLK deflector 221 and the second BLK deflector 222 on the optical path in the configuration in FIG. 8. In addition, a deflecting amplifier 148, a DAC 158, a buffer memory 168, a deflecting amplifier 149, a DAC 159, and a buffer memory 169 are added to control the first BLK deflector 232 and the second BLK deflector 234. Except for this configuration, FIG. 12 is the same as FIG. 8. In FIG. 12, constituent parts required for explaining the fifth embodiment are described. In general, a writing apparatus 100 includes other necessary components as a matter of course.

Connected to the deflection control circuit 112 are, in addition to the CPU 120, a laser length measuring system 132, a buffer memory 162, a buffer memory 163, a buffer memory 164, a buffer memory 165, a buffer memory 166, a buffer memory 167, a buffer memory 168, and a buffer memory 169 through a bus (not shown).

The DAC 158 is connected to the buffer memory 168, and the deflecting amplifier 148 is connected to the DAC 158. The deflecting amplifier 148 is connected to the first BLK deflector 232. The DAC 159 is connected to the buffer memory 169, and the deflecting amplifier 149 is connected to the DAC 159. The deflecting amplifier 149 is connected to the second BLK deflector 234.

The first BLK deflector 232 is controlled by the deflection control circuit 112 serving as an example of a voltage applying unit, the buffer memory 168, the DAC 158, and the deflecting amplifier 148 and applied with a voltage. The second BLK deflector 234 is controlled by the deflection control circuit 112 serving as an example of the voltage applying unit, the buffer memory 169, the DAC 159, and the deflecting amplifier 149 and applied with a voltage.

The first BLK deflector 221 and the second BLK deflector 222 on the upper stage and the first BLK deflector 232 and the second BLK deflector 234 on the lower stage are arranged on upstream sides of the first shaping aperture 203 and the second shaping aperture 206. To the electrodes of the first BLK deflector 232 and the second BLK deflector 234 on the lower stage, voltages equal to those applied to the electrodes of the first BLK deflector 221 and the second BLK deflector 222 on the upper stage are applied in a backward direction. For this reason, the electron beam 200 deflected by the first BLK deflector 221 and the second BLK deflector 222 on the upper stage may be preferably swung back by the first BLK deflector 232 and the second BLK deflector 234 on the lower stage.

Even though blanking is performed while swinging the electron beam 200 back by using the BLK deflectors on the upper stage and the BLK deflectors on the lower stage, as in the third embodiment, the BLK deflectors on the upper and lower stages are divided in a plurality of stages and independently pipeline-controlled, so that the same effect as in the third embodiment can be obtained.

As in the third embodiment, buffer memories for the deflectors are arranged on receiving sides in the fifth embodiment. However, as in the fourth embodiment, the buffer memories may be arranged on sending sides, i.e., on the deflection control circuit 112 side as a matter of course.

The embodiments have been described with reference to the concrete examples. However, the present invention is not limited to the concrete examples. For example, in the embodiments described above, the BLK aperture 214 is arranged on the upstream side of the first shaping aperture 203 on the optical path. However, the present invention is not limited to the embodiments. For example, the BLK aperture 214 may be preferably arranged on the downstream side of the second shaping aperture 206 on the optical path. In particular, assume that the BLK aperture 214 is arranged on the downstream side of the second shaping aperture 206 on the optical path. In this case, as described in the fifth embodiment, BLK deflectors are more preferably arranged on two stages, i.e., upper and lower stages and applied with equal voltages in a backward direction to swing the electron beam 200 back. With this configuration, amounts of current and irradiation positions on the first shaping aperture 203 and the second shaping aperture 206 can be prevented from being changed. As a result, the numbers of reflected electrons and secondary electrons generated by the first shaping aperture 203 and the second shaping aperture 206 can be prevented from being changed, and a charge-up state in a beam-on (blanking-off) state can be maintained. Consequently, since a degree of optical overlap between the first shaping aperture 203 and the second shaping aperture 206 does not change, a beam size can be prevented from being changed. Furthermore, doses of the electron beam 200 being incident on the first shaping aperture 203 and the second shaping aperture 206 do not change in a blanking-on/off state. For this reason, the first shaping aperture 203 and the second shaping aperture 206 do not change in temperature, so that a beam size can be prevented from being deteriorated by thermal expansion.

In the embodiments described above, different shots are deflected by different deflectors, respectively. However, the present invention is not limited to the configuration. For example, when a certain deflector A performs deflection for an nth shot, preparation for deflection of an (n+1)th shot may be performed by another deflector B.

Parts such as an apparatus configuration and a control method which are not directly necessary for explanation of the present invention are omitted in the above description. However, a necessary apparatus configuration and a necessary control method can be appropriately selected and used. For example, a configuration of a control unit which controls the writing apparatus 100 is omitted in the description. However, a configuration necessary for the control unit may be appropriately selected and used as a matter of course.

In addition, the spirit or scope of the present invention includes all charged particle beam writing apparatuses and all charged particle beam writing methods which include the elements of the invention and can be changed in design by those skilled in the art.

Furthermore, although the method of mask writing and the mask writing system were explained in the embodiments, the invention can be applied to direct writing method (that is method to write pattern on resist on silicon wafer) and direct writing system.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A pattern writing method using a charged particle beam, comprising:
   irradiating a shot of a charged particle beam; and
   deflecting the charged particle beam of the shot using a first deflector to set a beam-on state and a beam-off state for each shot and using a second deflector to form a variable-shaped beam for each shot, the first and second deflectors being arranged on an optical path of the charged particle beam, so as to write a pattern on a target object,
   wherein any one of the first and second deflectors controls deflection of a charged particle beam of a shot different from a shot which is controlled in deflection by another deflector in the same period, and a voltage of the second deflector reaches a target voltage for each shot before a charged particle beam for each shot reaches the second deflector.

2. The pattern writing method according to claim 1, wherein the deflecting the charged particle beam comprises causing the first and second deflectors to perform a pipeline process with respect to shots of the charged particle beam.

3. A pattern writing method using a charged particle beam, comprising:
   irradiating a shot of a charged particle beam;
   deflecting a charged particle of the beam to write a pattern on a target object;
   independently applying voltages to deflectors so that an original voltage applied to a deflector on an upper stage of a plurality of stages is applied to a deflector on a lower stage of the plurality of stages in accordance with movement of the charged particle, the original voltage applied to the deflector on the upper stage and the original voltage applied to the deflector on the lower stage being same in electrical polarity, by using the deflectors obtained by dividing a base deflector to cause the charged particle to obtain a predetermined amount of deflection in the plurality of stages, when deflecting the charged particle;
   beginning preparation for deflection of the next shot by at least another deflector when deflecting by one of the deflectors for a certain shot; and
   performing control which charges an appropriate voltage as a sum of the deflectors to the charged particle irradiated, when deflecting the charged particle.

4. A charged particle beam writing apparatus, comprising:
   a first deflector configured to not deflect a charged particle beam to set a beam-on state and to deflect the charged particle beam to set a beam-off state;
   a second deflector configured to deflect the charged particle beam to shape the beam; and
   a third deflector configured to deflect the charged particle beam to a predetermined position on a target object,
   wherein at least two deflectors of the first, second, and third deflectors control deflection of charged particle beams of different shots in the same period, and a voltage of at least one of the second and third deflectors reaches a target voltage for each shot before a charged particle beam for each shot reaches the at least one of the second and third deflectors.

5. The charged particle beam writing apparatus according to claim 4, further comprising:
   a plurality of timing signal generating units configured to generate and to output first, second, and third timing signals to sequentially deflect charged particle beams of the same shot by the first, second, and third deflectors, respectively.

6. The charged particle beam writing apparatus according to claim 5,
wherein the plurality of timing signal generating units are configured to independently generate the first, second, and third timing signals.

7. The charged particle beam writing apparatus according to claim 6, further comprising:
a first voltage applying unit configured to receive the first timing signal and to apply a voltage to the first deflector on the basis of the first timing signal;
a second voltage applying unit configured to receive the second timing signal and to apply a voltage to the second deflector on the basis of the second timing signal; and
a third voltage applying unit configured to receive the third timing signal and to apply a voltage to the third deflector on the basis of the third timing signal.

8. The charged particle beam writing apparatus according to claim 7, further comprising:
a first buffer configured to temporarily store a first deflection signal to be output to the first voltage applying unit;
a second buffer configured to temporarily store a second deflection signal to be output to the second voltage applying unit; and
a third buffer configured to temporarily store a third deflection signal to be output to the third voltage applying unit.

9. The charged particle beam writing apparatus according to claim 8, further comprising:
a distribution unit configured to generate the first, second, and third deflection signals to distribute the first, second, and third deflection signals to the first, second, and third buffers, respectively.

10. The charged particle beam writing apparatus according to claim 4, further comprising:
means for causing the first, second, and third deflectors to perform a pipeline process with respect to shots of the charged particle beam.

11. A charged particle beam writing apparatus, comprising:
an irradiation unit configured to irradiate a charged particle beam;
deflectors of a plurality of stages, each deflector having a deflector length shorter than a first deflector length that causes each charged particle in the charged particle beam to obtain a predetermined amount of deflection; and
a voltage applying unit configured to independently apply voltages to the deflectors of the plurality of stages so that an original voltage applied to the deflector of an upper stage of the plurality of stages is applied to the deflector of a lower stage of the plurality of stages in accordance with movement of the charged particle, the original voltage applied to the deflector of the upper stage and the original voltage applied to the deflector of the lower stage being same in electrical polarity.

12. The charged particle beam writing apparatus according to claim 11, wherein the deflectors have stages separated from one another.

13. A charged particle beam writing apparatus, comprising:
a first deflector configured to not deflect a charged particle beam to set a beam-on state for each shot and to deflect the charged particle beam to set a beam-off state for each shot;
a second deflector configured to deflect the charged particle beam to form a variable-shaped beam for each shot; and
a third deflector configured to deflect the charged particle beam to a predetermined position on a target object,
wherein at least two deflectors of the first, second, and third deflectors control deflection of charged particle beams of different shots in the same period, and a voltage of at least one of the second and third deflectors reaches a target voltage for each shot before a charged particle beam for each shot reaches at least one of the second and third deflectors.

14. The pattern writing method using a charged particle beam according to claim 1, further comprising:
adjusting a voltage applied to the second deflector to form the variable-shaped beam.

15. The charged particle beam writing apparatus according to claim 13, wherein a voltage applied to the second deflector is adjusted to form the variable-shaped beam.

* * * * *